United States Patent [19]

Forget et al.

[11] 4,214,946

[45] Jul. 29, 1980

[54] SELECTIVE REACTIVE ION ETCHING OF POLYSILICON AGAINST SIO2 UTILIZING SF6-CL2-INERT GAS ETCHANT

[75] Inventors: Lawrence E. Forget, Poughkeepsie; Robert A. Gdula, Pleasant Valley; Joseph C. Hollis, Poughquag, all of N.Y.

[73] Assignee: International Business Machines Corporation, Armonk, N.Y.

[21] Appl. No.: 13,696

[22] Filed: Feb. 21, 1979

[51] Int. Cl.² .................................. H01L 21/308
[52] U.S. Cl. ................... 156/643; 156/646; 156/657; 156/662; 204/192 E; 252/79.1
[58] Field of Search .............. 252/79.1; 156/643, 646, 156/657, 662; 204/192 E

[56] References Cited

U.S. PATENT DOCUMENTS

| | | | |
|---|---|---|---|
| 3,615,956 | 10/1971 | Irving et al. | 156/646 |
| 4,104,086 | 8/1978 | Bondur et al. | 156/643 |
| 4,104,090 | 8/1978 | Pogge | 156/657 |
| 4,157,269 | 6/1979 | Ning et al. | 156/643 |
| 4,159,915 | 7/1979 | Anantha et al. | 156/662 |

OTHER PUBLICATIONS

Logan et al., "Method . . . Devices" IBM Technical Disclosure Bull. vol. 21, No. 4 (9/78) pp. 1466-1467.
Bondur et al., "RF . . . Gas" IBM Technical Disclosure Bull. vol. 18, No. 6 (11/75) p. 1897.
Coburn "Increasing . . . Si " IBM Technical Disclosure Bull. vol. 20, No. 2 (7/77) p. 757.

Primary Examiner—Jerome W. Massie
Attorney, Agent, or Firm—Wesley DeBruin

[57] ABSTRACT

Disclosed is an improved Reactive Ion Etch (RIE) technique for etching polysilicon or single crystal silicon as must be done in Very Large Scale Integration (VLSI) using silicon technology. It teaches the use of an etch gas that consists of a mixture of sulfur hexafluoride ($SF_6$) and chlorine ($Cl_2$) diluted with inert gas. This etch gas allows an RIE process which combines the very desirable features of selectivity (high Si/SiO2 etch rate ratio) and directionality which creates vertical side walls on the etched features. Vertical side walls mean no mask undercutting, hence zero etch bias.

It is particularly applicable to device processing in which micron or sub-micron sized lines must be fabricated to extremely close tolerances. It is a distinct improvement over wet chemical etching or plasma etching as it is conventionally applied.

5 Claims, 11 Drawing Figures

ISOTROPIC ETCHING

DIRECTIONAL ETCHING

BEFORE RIE

AFTER RIE

FIELD AREA OF
VLSI SILICON CHIP

AFTER NITRIDE AND
OXIDE ARE OPENED
BY PLASMA ETCHING
AND PHOTORESIST
MASK IS REMOVED

AFTER RIE TO OPEN
ROI WELLS IN
⟨100⟩ Si PRIOR
TO OXIDATION

AFTER ROI
GROWTH

SELECTIVE REACTIVE ION ETCHING OF POLYSILICON AGAINST SIO₂ UTILIZING SF₆-CL₂-INERT GAS ETCHANT

DESCRIPTION OF THE INVENTION

The invention relates to Reactive Ion Etching. More specifically the invention relates to improved Selective Reactive Ion Etching of Polysilicon Against SiO$_2$.

It is a primary object of the invention to provide an improved Reactive Ion Etch (RIE) technique wherein polysilicon is etched selectively against SiO$_2$.

It is a further object of the invention to provide an improved Reactive Ion Etch (RIE) technique wherein by the employment of a gas mixture of SF$_6$ and Cl$_2$ diluted with inert gas polysilicon is selectively etched against silicon with an optimum etch rate ratio (>25:1) while vertical side walls are obtained with 1 micron wide polysilicon lines.

Other objects and advantages of the present invention are inherent in the structure disclosed in the specification and drawings and will be apparent to those skilled in the art as the detailed description proceeds.

RIE is particularly applicable in device processing for producing fine lines with tight tolerances and zero bias. For double poly FETs (polysilicon field effect transistors), polysilicon must be etched selectively against SiO$_2$. When 4000 Å polysilicon gates must be etched over thin (250 to 500 Å) gate oxide, high etch rate ratios (>25:1) must be obtained while 1 micron geometries dictate zero etch bias must be held. We have shown that in E-gas (SF$_6$ in Helium) RIE, 2 etching mechanisms are simultaneously operative. One is a purely chemical mechanism probably

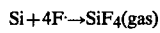

$$Si + 4F \cdot \rightarrow SiF_4(gas)$$

which leads to isotropic etching (see FIG. 1A) and high Si/SiO$_2$ etch rate ratios. The other is probably an ion assisted mechanism perhaps something like

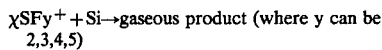

$$\chi SF_y^+ + Si \rightarrow gaseous\ product\ (where\ y\ can\ be\ 2,3,4,5)$$

which leads to directional etching (see FIG. 1B) and vertical side walls. E-gas RIE can give zero etch bias when parameters are adjusted to force directional etching, but this is achieved at the expense of high etch rate ratios. The best compromise allows ≈12:1 E.R.R. with vertical sidewalls (zero etch bias). This may not be high enough for designs which use 250 Å gate oxides.

We have observed that using mixtures of SF$_6$ and Cl$_2$ diluted with inert gas widens the parameter space in which directional etching (vertical sidewalls, zero etch bias) dominates compared to E-gas RIE. This allows the RIE to be operated at lower power levels which improves E.R.R. yet maintains vertical or nearly vertical sidewalls. E.R.R. >40:1 with vertical sidewalls (zero etch bias) has been achieved in our experiments.

BACKGROUND OF THE INVENTION AND PRIOR ART

The important step in the manufacture of semiconductor chips and thin film circuitry is the etching of the different layers such as polysilicon and silicon which make up the finished semiconductor chip or the thin film circuit. In the manufacture of thin film circuits, one method of etching has been to overlay the surface to be etched with a suitable mask and immerse the circuit so masked in a chemical solution which attacks the surface to be etched while leaving the mask intact. It has been difficult with the chemical etching processes presently known to achieve well defined edges on the etched surfaces. The difficulty arises because the chemicals used for etching tend to undercut the mask, i.e., the rough chemical seeps under the mask and continues to attack the surface to be etched even under the mask area. A related difficulty which is encountered with certain materials is that the chemical action tends to eat through the surface to be etched and attacks the substrate beneath. It is, therefore, very difficult to use wet chemical etching to achieve fine structures. Fine structures being defined as structures having geometries on the order of one micron.

Etching of thin film circuits has also been done by a process sometimes called sputter etching. Typically a container such as a bell jar is filled with an inert gas such as argon. In the container are placed an anode and a cathode, the latter of which is negatively biased relative to the former, e.g., by means of an applied rf signal. A surface to be etched is covered by a suitable mask of a material such as photoresist, silicon nitride, etc. and is then placed on the cathode. When a negative bias is applied to the cathode the inert gas in the region between the cathode and the anode is ionized and the positive ions are attracted towards the cathode. Those ions which strike the surface to be etched serve to knock atoms off the surface thereby gradually etching through the material. In this process the photoresist material forming the mask is also etched typically at about the same rate or faster rate than the surface to be etched. Therefore thick masking layers on which it is difficult to hold tolerances are required. Although this sputter etching process produces better defined edges than the chemical etching process, it is typically very slow, especially on tantalum, or nitride surfaces which are important in thin film work.

In the manufacture of semiconductor chips, another procedure (sometimes called plasma etching) is used in which a container such as a bell jar is filled with a gas such as CF$_4$, or SF$_6$, whose constituent ions are chemically reactive. A surface to be etched is covered by a mask and inserted into the container along with the reactive gas. To etch the surface, an rf exciting coil around the container is activated to excite the CF$_4$ or SF$_6$, thereby disassociating the CF$_4$ or SF$_6$ and forming various positive and negative ions. The disassociated ions apparently then chemically interact with the surface to be etched producing various gases as a reaction product. As with the wet chemical etching process described above, this type of plasma etching also results in undercutting of the mask areas so that it is difficult to achieve well defined edges.

Reactive ion etching or plasma ion etching is well known in the prior art. The following prior art patents and summaries are submitted to generally represent the state of the prior art.

Reference is made to U.S. Pat. No. 3,573,192, entitled "Plasma Generating Apparatus" granted March 30, 1971 to R. L. Bersin et al.

The abstract of the disclosure of the Bersin et al patent reads as follows:

"A plasma, or ionized gas, generating apparatus for reaction of the plasma with non-gaseous substances in a container, the apparatus having a support structure defined by spaced apart support plates which are interconnected by a plurality of posts. A pair of elongate electrode plates for each container is mounted on the support structure so that at least one of the plates can be moved toward and into engagement with the container for grasping the container and mounting it on the apparatus. The electrode plates have a concave configuration to grasp the container and include a layer of an electrically insulating material on the concave side to prevent short circuits between the electrode plates and the container and to facilitate the slideable insertion and removal of the container from between the plates. A supply manifold is carried by the support structure and includes a plurality of supply conduits for connection with the containers and the transmission of gas into the containers. An exhaust manifold is similarly carried by the support structure and connected with the container for removal of the gas and the plasma from the container."

Reference is made to U.S. Pat. No. 3,679,502 entitled "Gaseous Nonpreferential Etching of Silicon", granted July 25, 1972 to R. G. Hays. The Hays patent discloses a silicon surface etched or polished with a gaseous mixture comprising sulfur hexafluoride $SF_6$ of high purity and a carrier gas such as hydrogen at temperatures between 950° C. and 1250° C. The sulfur hexafluoride should have a low nitrogen concentration with a preferred nitrogen concentration being less than 200 parts per million by weight.

Reference is made to U.S. Pat. No. 3,806,365 entitled "Process for Use in the Manufacture of Semiconductive Devices", granted Apr. 23, 1974 to A. Jacob. The ABSTRACT of the Jacob patent reads as follows:

"A process step for use in the manufacture of semiconductor devices. To enable the removal of all the photoresist material along with its inorganic contamination, after development and etching of preselected portions of an oxide layer on a semiconductor slice, the material is exposed to a low pressure (few torr) RF generated 'cold' plasma (200°–300° C.), where the plasma is a homogenous gaseous mixture of oxygen and organo-halides. The organo-halide preferably is a binary or ternary mixture where each component preferably includes no more than two carbon atoms per molecule and is desirably fully halogen-substituted. One of the substituents should include a predominance of either fluorine or fluorine-bromine combinations."

Reference is made to U.S. Pat. No. 3,880,684, entitled "Process for Preparing Semiconductor", granted April 29, 1975 to H. Abe. A semiconductor is prepared by continuously etching at least two types of silicon compound layers, such as silicon dioxide ($SiO_2$), silicon nitride ($Si_3N_4$) or polycrystalline silicon which are formed on a silicon substrate. A freon gas plasma is used for etching so that the two types of silicon compound layers are continuously etched in a sloped form with undercutting, as occurs in conventional chemical solution etching.

Reference is made to U.S. Pat. No. 3,923,568 entitlted "Dry Plasma Process for Etching Noble Metal" granted Dec. 2, 1975 to R. L. Bersin. The Bersin patent discloses a process for etching noble metals, particularly, for removing selected areas of thin films of electrically conductive noble metals, by contacting exposed areas of noble metal with a plasma that must include both fluorine and chlorine and may, optionally also contain oxygen.

Reference is made to U.S. Pat. No. 3,971,684, entitled "Etching Thin Film Circuits and Semiconductor Chips", granted July 27, 1976 to S. Y. Muto. The Muto patent discloses a method of etching either thin film circuits or semiconductor chips which is capable of producing extremely well-defined edges on etched materials, while at the same time achieving rapid etching rates. According to the method a gas or gas mixture whose constituent ions are chemically reactive is placed in a container along with a cathode electrode and an anode electrode. A surface to be etched is covered by a suitable mask and mounted on one of the electrodes, e.g., the cathode which is negative-biased relative to the remaining electrode, e.g., by applying an RF biasing signal. An electric field is thus established in the region between the cathode and the anode, and serves to dissociate the reactive gas. Chemically reactive gas ions are attracted to the cathode and thereby impinge on the sample to be etched. Apparently, the surface is etched both by chemical interaction with the active ions and by the momentum transfer of the ions impinging on the surface. By virtue of the electric field attracting ions to the cathode, the ions impinge on the surface to be etched predominantly in a direction perpendicular to that surface, so that the process produces well-defined vertically etched sidewalls. Chemically reactive gases such as $SF_6$ or $CCl_2F_2$ may be employed, however, $CF_4$ is preferred.

Reference is made to U.S. Pat. No. 3,994,793 entitled "Reactive Ion Etching of Aluminum", granted Nov. 30, 1976 to J. M. Harvilchuck et al. The Harvilchuck et al patent discloses a process for reactive ion etching of aluminum wherein a masked layer of aluminum supported on a substrate is exposed to an RF plasma formed by imposing an RF voltage across at least two spaced electrodes in a gaseous environment composed of an inert gas and a gas selected from the group consisting of $CCl_4$, $Cl_2$, $Br_2$, and $HCl$.

Reference is made to U.S. Pat. No. 4,026,742, entitled "Plasma Etching Process for Making A Microcircuit Device", granted May 31, 1977 to K. Fujino. The Fujino patent discloses a method of making a microcircuit device wherein a uniform film of electrically conductive metal is deposited on the microcircuit surface and selectively removed from areas exposed through a mask. The improvement comprises the steps of contacting the exposed metal with a reactive halogenated gas in plasma state to convert the metal to a metal halide; and removing the metal halide to form a pattern of electrically conductive metal on the device. The plasma can be generated in a reaction chamber with a high frequency electromagnetic field. The process is useful in forming a desired pattern of metal for electrodes or wiring on a semiconductor substrate or other microcircuit base. The process is particularly useful for etching tungsten or molybdenum metal patterns. The preferred halogenated materials include prehalogenated organic compounds, such as trichlorofluoromethane, dichlorodifluoromethane, or other volatile organic compounds containing halogen atoms having an atomic number between 9 and 35, especially chlorine and fluorine atoms; however, brominated compounds such as $CHBr_3$, $CH_2BR_2$ or $CH_3BR$, may also be used.

Reference is made to U.S. Pat. No. 4,052,251 entitled "Method of Etching Sapphire Utilizing Sulfur Hexafluoride" granted Oct. 4, 1977 to C. E. Weitzel. The Weitzel patent discloses a process for forming a blind hole having an isosceles trapezoidal cross-section in a sapphire substrate using a sulfur hexafluoride gas etchant and an etch mask of silicon nitride on top of silicon dioxide. A composite of sapphire, silicon dioxide and silicon nitride wherein silicon dioxide is located in between the sapphire and the silicon nitride are congruently apertured.

Reference is made to U.S. Pat. No. 4,069,096 entitled "Silicon Etching Process" granted Jan. 17, 1978 to A. R. Reinberg et al. The Reinberg et al patent discloses a process for etching silicon including the step of contacting said silicon with a plasma derived from a gas comprising $CCl_4$, an inert gas, and a gas selected from the group consisting of $Cl_2$ and HCl.

Reference is made to U.S. Pat. No. 4,094,732, entitled "Silicon Etching Process" granted June 13, 1978 to A. R. Reinberg. The Reinberg patent discloses a process for etching silicon including the step of contacting the silicon with a plasma derived from a gas comprising $CCl_4$ and an inert gas. The inert gas is nitrogen or argon.

DISCLOSURE OF THE INVENTION

In accordance with the illustrated preferred embodiment the present invention provides a method of etching thin film circuits or semiconductor chips which is capable of producing extremely well defined edges on etched materials while at the same time achieving rapid etching rates. According to the method a gas comprised of $Cl_2$ and $SF_6$ in an inert gas such as helium is placed in a container along with a cathode electrode and an anode electrode. A surface to be etched is covered by a suitable mask and mounted on one of the electrodes, e.g., the cathode which is negative biased relative to the remaining electrodes, e.g., by applying an RF biasing signal. An electric field is thus established in the region between the cathode and the anode, and serves to dissociate the reactive gas forming a plasma. Chemically reactive gas species are attracted to the cathode and thereby impinge on the sample to be etched. Apparently, the surface is etched by both chemical interaction with various active species and by the momentum transfer of positive ions impinging on the surface. By virtue of the electric field attracting ions to the cathode, the ions impinging on the surface to be etched arrive predominantly in a direction perpendicular to that surface so that the process produces well defined vertically etched sidewalls. Still further, the use of the gas mixture of $Cl_2$ and $SF_6$ in an inert gas allows polysilicon to be selectively etched against silicon dioxide or silicon nitride with a high etch rate ratio and vertical sidewalls.

Very Large Scale Integrated (VLSI) devices in silicon technology require etching of silicon into fine (submicron) patterns and lines. To accomplish this, two attributes of the process are necessary: directionality (anisotropy or vertical etching) because it can easily be shown that, for isotropic etching (wet chemical), the minimum line width that can be etched is 2× the etched depth; and selectivity (etching silicon or polysilicon without eroding the mask and being able to stop at a very thin $SiO_2$ insulating layer beneath the silicon). With these two attributes, etch bias can be held to zero without disturbing the vertical structure.

Figure 1A:
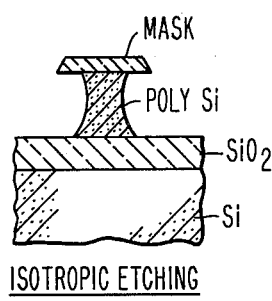
FIG. 1 shows a cross-sectional view of a poly-silicon line exhibiting isotopic etching as is achieved with wet chemical etching or plasma etching. Note the severe undercutting of the etch mask resulting in a substantial difference in size of the etched line compared to the mask. This difference is the etch bias.
FIG. 1B shows a cross-sectional view of a poly-silicon line exhibiting directional etching as achieved in this invention. Note the absence of etch bias.
Figure 1B:
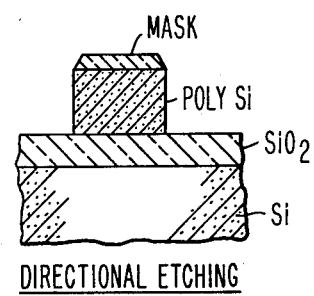
Figure 5A:
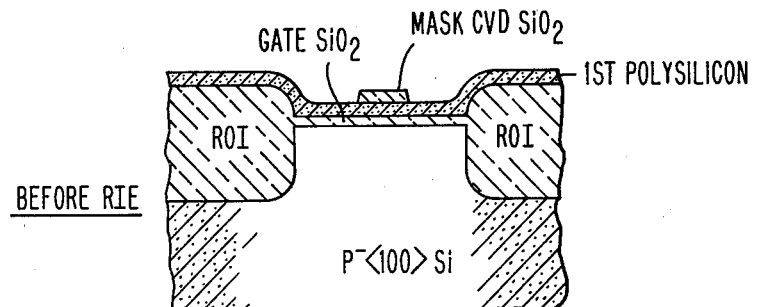
FIG. 5A shows the active area of an FET prior to delineation of the first polysilicon level.
Figure 5B:
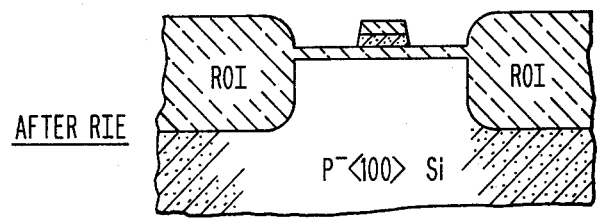
FIG. 5B shows the same area after RIE as taught by this invention to define the gate electrode in the first polysilicon level. Note the absence of mask undercut. This is important because the subsequent step is an ion implant to form the source and drain using the defined gate as a mask (self alignment). Undercutting of the mask during RIE would cause misalignment of the source and drain with respect to the gate.

Conventional plasma etching ($CF_4$ or $CF_4+O_2$) can provide selectivity (as can wet chemical etching) but the etching is isotropic (mask undercut) (See FIG. 1). RIE with chlorinated etch gases can provide directionality but does not have good selectivity (typically 5-6:1) and is very non-uniform when etching polysilicon. RIE with $SF_6$ is known (Muto patent 3,971,684, supra) to etch silicon and can provide either high selectivity (with isotropic etching) or directionality (with low selectivity). It has not been possible to obtain both directionality and high selectivity simultaneously.

Figure 2:
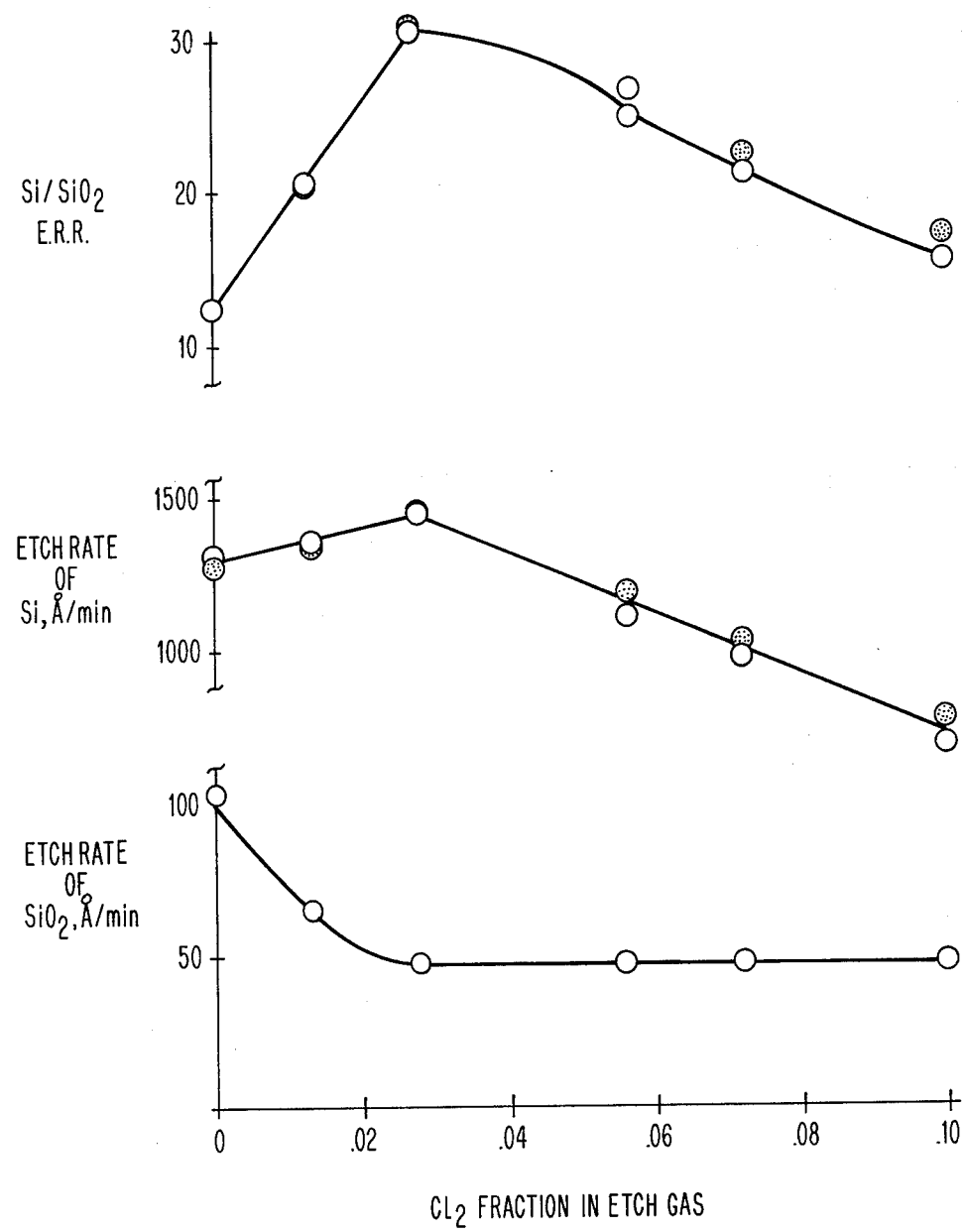
FIG. 2 shows some actual data from an RIE experiment in which the $SF_6$ content of E-gas (10% $SF_6$ 90% He) is replaced by $Cl_2$ all other conditions being held the same. The important things to notice are that: (1) the etch rate of silicon is increased by the first substitutions of $Cl_2$ for $SF_6$ then with further $Cl_2$ substitution decreases (middle curve), when all the $SF_6$ is replaced by $Cl_2$ the silicon etch rate is significantly lower; (2) the etch rate of $SiO_2$ is *rapidly decreased* by the initial substitutions of $Cl_2$ for $SF_6$ then levels off, (bottom curve); (3) this results in a marked improvement in $Si/SiO_2$ etch rate ratio (ERR) when part of the $SF_6$ is replaced by $Cl_2$ (top curve). The conditions of the experiment are such that the etch is directional producing essentially vertical profiles.
Figure 3:
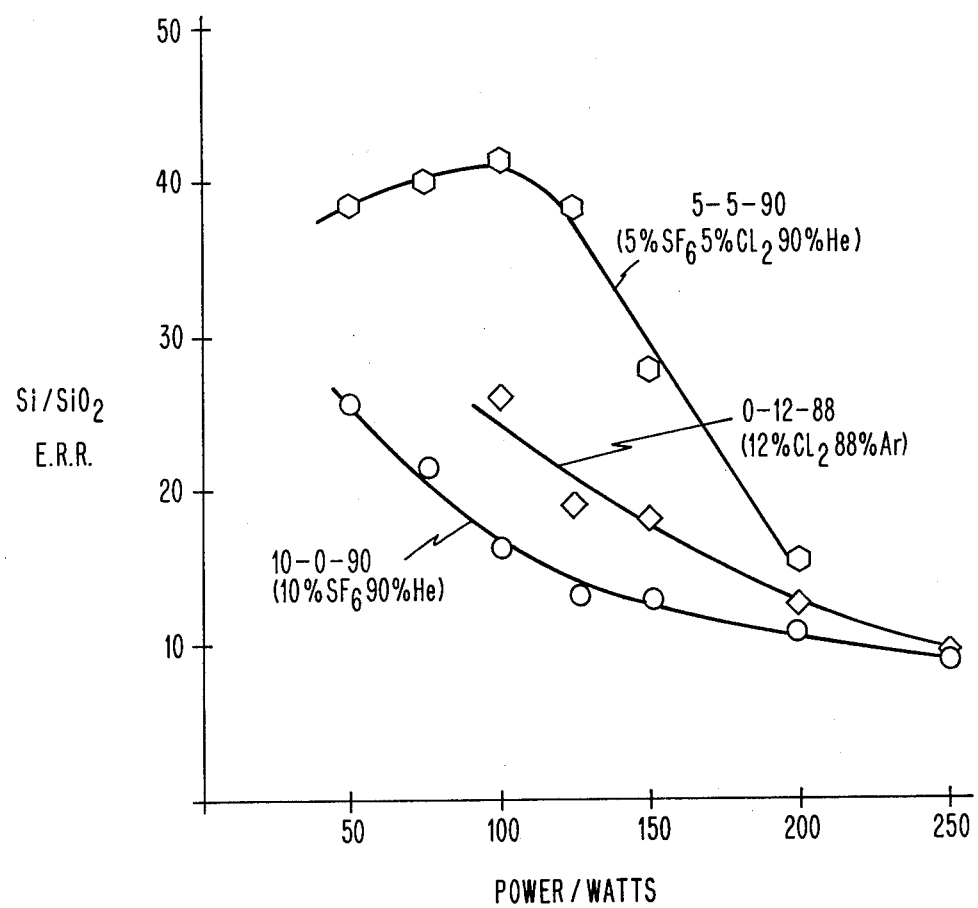
FIG. 3 shows the results of an RIE experiment comparing 3 different etch gases: E-gas (10% $SF_6$, 90% He); diluted $Cl_2$ gas (12% $Cl_2$, 88% Ar); and an improved gas mixture as taught by this invention (5% $SF_6$, 5% $Cl_2$, 90% He). It shows how their $Si/SiO_2$ etch rate ratios vary as a function of input power. It is clear that for all power levels tested that the 5-5-90 gas has an improved ERR compared to either of the conventional types. This is a clear case of synergism.
Figure 4:
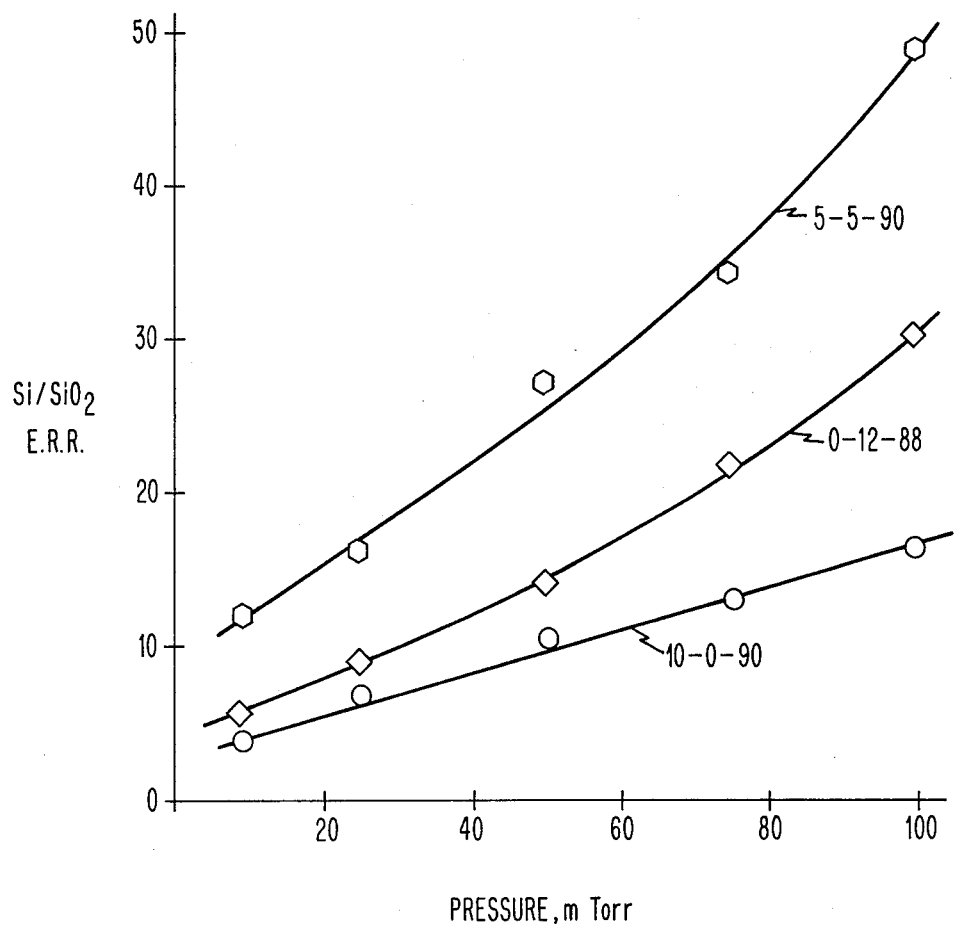
FIG. 4 shows the results of the same experiment as FIG. 3 but as a function chamber pressure inside the etcher. For all pressures tested 5-5-90 gas has an improved ERR compared to either conventional gas.
Figure 6A:
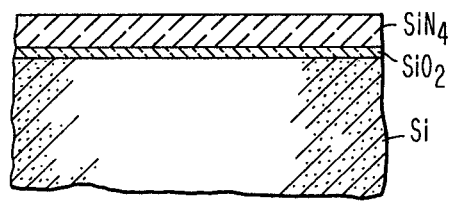
FIG. 6A shows the field area of a VLSI silicon chip where Recessed Oxide Isolation (ROI) is to be grown. The $Si_3N_4$—$SiO_2$ stack will be the oxidation mask.
Figure 6B:
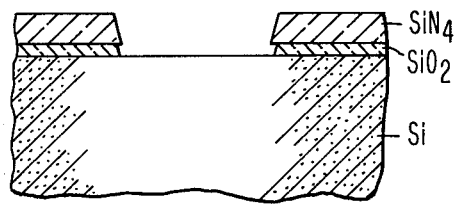
FIG. 6B shows the $Si_3N_4$—$SiO_2$ stack after delineation by plasma etching and stripping of the photoresist mask.
Figure 6C:
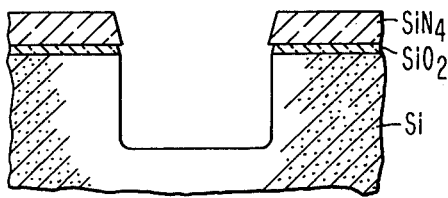
FIG. 6C shows the same area after RIE as taught in this invention to open the ROI wells in <100> silicon prior to oxidation. Note the absence of mask undercut, which makes control of the critical bias and tolerances possible.
Figure 6D:
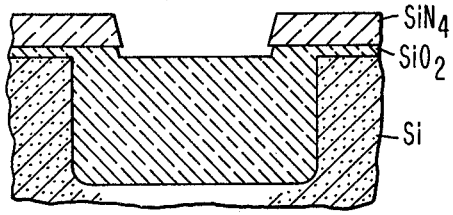
FIG. 6D shows the same area after ROI growth.

This invention makes use of the unexpected result that substitutions of $Cl_2$ for part of the $SF_6$ in dilute mixtures of $SF_6$ in inert gas, such as He produce RIE behavior that is considerably more selective for Si than either Cl$_2$ RIE or SF$_6$ RIE alone while retaining the necessary directionality and the ease of etching polysilicon (see FIGS. 2, 3, 4). This is a clear case of synergism where the combination of Cl$_2$+SF$_6$ unexpectedly is superior to either Cl$_2$ or SF$_6$ alone.

The invention has particular utility for VLSI silicon devices, particularly FETs, where the first and second level of conductors are polysilicon. For first level polysilicon etching in the active area of the device, a film of highly conductive polysilicon about 4000 Å thick must be sub-etched. Underneath this polysilicon is the gate oxide (thermal SiO$_2$) of the device which is only 200 Å to 500 Å thick. The polysilicon must be etched into patterns, some of which are only 1 micron to 3 microns wide without significantly cutting into the underlying gate oxide. A 20% over-etch must be tolerated to make sure all the polysilicon on all the wafers is etched through. Zero etch bias must be maintained.

The conditions that we use are:

Diode configuration etcher (as in Muto patent)

Wafers loaded onto driven electrode which is water cooled

Surface of driven electrode covered with fused SiO$_2$ (preferred)—Aluminum, steel, silicon (possible)

Frequency of excitation=40.68 MHz (preferred)—10 kHz to 10 GHz (possible)

Etch gas 5% SF$_6$, 5% Cl$_2$, 90% He (preferred)—1% SF$_6$, 9% Cl$_2$ to 9% SF$_6$, 1% Cl$_2$ (possible)—Argon can be substituted for He Flow rate 25 std. cm$^3$/minute (preferred)—5 to 100 (possible)

Chamber pressure 100 mTorr (preferred)—5 to 200 (possible)

Power input 0.25 watts/cm$^2$ (preferred)—0.1 to 0.5 (possible)

Mask material SiO$_2$ (preferred)—Photo resist, Si$_3$N$_4$, Al (possible)

Under these conditions the polysilicon etches at about 1500 Å/min. while SiO$_2$ etches at about 50 Å/min. providing an ERR of about 30:1. Under these conditions the etching is directional, giving zero etch bias.

The etching of the second level of polysilicon is a similar problem and the same conditions can be used.

Another application is silicon etching to form ROI. Here, <100> silicon is masked with oxide and nitride layers and must be etched about 5000 Å with vertical walls and zero etch bias (FIG. 6). Selectivity is also important: about 5000 Å silicon must be etched without thinning the nitride top layer of the mask because it must later serve as an oxidation mask in the subsequent ROI growth. Here, we have found that the gas mixture should be higher in Cl$_2$ and lower in SF$_6$. Other conditions being the same, we prefer to use a gas of composition 2.5% SF$_6$, 7.5% Cl$_2$, 90% He. Under these conditions, <100> silicon etches about 800 Å/min. while Si$_3$N$_4$ etches about 33 Å/min. for an ERR of about 24:1 with directional etching and zero etch bias.

While the invention has been particularly shown and described with reference to the preferred embodiments thereof, it will be understood by those skilled in the art that various changes in form and detail may be made therein without departing from the spirit and scope of the invention.

Having thus described our invention, what we claim as new, and desire to secure by Letters Patent is:

1. An improved technique of selective reactive ion etching of polysilicon against silicon dioxide, said technique being characterized by the employment of a plasma derived from a gas mixture consisting essentially of x parts of SF$_6$, y parts of Cl$_2$, and z parts of inert gas and wherein x+y+z is essentially one hundred, x+y is approximately ten, and x and y are respectively greater than zero.

2. An improved technique of selective reactive ion etching of polysilicon against silicon dioxide, as recited in claim 1 further characterized in that x has a magnitude in the order of one to nine.

3. An improved technique of selective reactive ion etching of polysilicon against silicon dioxide, as recited in claim 1 wherein x has a magnitude of approximately two and one-half, y has a magnitude of approximately seven and one-half, and z has a value of approximately ninety.

4. An improved technique of selective reactive ion etching of polysilicon against silicon dioxide, as recited in any one of the claims 1, 2 or 3, further characterized that the inert gas is helium.

5. An improved technique of selective reactive ion etching of polysilicon against silicon dioxide, as recited in any one of the claims 1, 2 or 3, further characterized that the inert gas is argon.

* * * * *